United States Patent
Cao et al.

(10) Patent No.: US 8,422,277 B2
(45) Date of Patent: Apr. 16, 2013

(54) FIELD ASSISTED SWITCHING OF A MAGNETIC MEMORY ELEMENT

(75) Inventors: Xin Cao, Londonderry (GB); Haiwen Xi, San Jose, CA (US); Wenzhong Zhu, Apple Valley, MN (US); Robert Lamberton, Limavady (GB); Kaizhong Gao, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 239 days.

(21) Appl. No.: 12/939,751

(22) Filed: Nov. 4, 2010

(65) Prior Publication Data

US 2012/0111952 A1    May 10, 2012

(51) Int. Cl.
*G11C 11/00* (2006.01)
(52) U.S. Cl.
USPC ............................ 365/158; 365/171; 365/173
(58) Field of Classification Search .................. 365/158, 365/148, 171, 173
See application file for complete search history.

(56) References Cited

U.S. PATENT DOCUMENTS

| | | | |
|---|---|---|---|
| 6,714,444 B2 | 3/2004 | Huai et al. | |
| 7,180,770 B2 | 2/2007 | Perner et al. | |
| 7,241,631 B2 | 7/2007 | Huai et al. | |
| 7,242,045 B2 | 7/2007 | Nguyen et al. | |
| 7,310,265 B2 | 12/2007 | Zheng et al. | |
| 7,372,116 B2 | 5/2008 | Fullerton et al. | |
| 7,486,552 B2 | 2/2009 | Apalkov et al. | |
| 7,502,249 B1 * | 3/2009 | Ding | 365/158 |
| 7,525,862 B1 | 4/2009 | Sun et al. | |
| 2006/0171198 A1 * | 8/2006 | Saito et al. | 365/158 |
| 2008/0291720 A1 | 11/2008 | Wang et al. | |
| 2008/0291721 A1 * | 11/2008 | Apalkov et al. | 365/173 |
| 2010/0034008 A1 | 2/2010 | Wang et al. | |

* cited by examiner

*Primary Examiner* — Richard Elms
*Assistant Examiner* — Hien Nguyen
(74) *Attorney, Agent, or Firm* — Hall Estill Attorneys at Law

(57) ABSTRACT

Method and apparatus for writing data to a magnetic memory element, such as a spin-torque transfer random access memory (STRAM) memory cell. In accordance with various embodiments, a write current is applied through a magnetic memory element to initiate magnetic precession of the element to a desired magnetic state. A flow of a field assist current is subsequently initiated adjacent the magnetic memory element during continued application of the write current to induce a magnetic field upon the element. The field assist current persists after the write current is terminated to provide field assisted precession to the desired magnetic state.

20 Claims, 4 Drawing Sheets

FIELD ASSISTED SWITCHING OF A MAGNETIC MEMORY ELEMENT

SUMMARY

Various embodiments of the present invention are generally directed to a method and apparatus for writing data to a magnetic memory element, such as a spin-torque transfer random access memory (STRAM) memory cell.

In accordance with various embodiments, a write current is applied through a magnetic memory element to initiate magnetic precession of the element to a desired magnetic state. A flow of a field assist current is subsequently initiated adjacent the magnetic memory element during continued application of the write current to induce a magnetic field upon the element. The field assist current persists after the write current is terminated to provide field assisted precession to the desired magnetic state.

These and various other features and advantages which characterize the various embodiments of the present invention can be understood in view of the following detailed discussion and the accompanying drawings.

DETAILED DESCRIPTION

The present disclosure sets forth improvements in the manner in which data may be written to magnetic memory elements, such as but not limited to spin-torque transfer random access memory (STRAM) cells.

An array of solid-state magnetic memory cells can be used to provide non-volatile storage of data bits. Some magnetic memory cell configurations include a programmable resistive element, such as a magnetic tunneling junction (MTJ). An MTJ includes a pinned reference layer having a fixed magnetic orientation in a selected direction. A free layer is separated from the reference layer by a tunneling barrier, with the free layer having a selectively variable magnetic orientation. The orientation of the free layer relative to the fixed layer establishes an overall electrical resistance of the cell, which can be detected during a read sense operation.

While magnetic memory elements have been found to efficiently store data in a compact semiconductor array environment, one issue related to such elements is the power required to produce the different programmed states. It has been found that relatively high magnitude, long duration current pulses may be necessary to reliably program the memory elements to a selected programmed state.

Accordingly, the present disclosure is generally directed to field assisted writing of data to magnetic memory elements. An assist current is applied adjacent a memory cell during a programming (data write) operation. The assist current generates an ampere (assist) field which acts upon the memory element during and after the application of write current thereto. The assist field can reduce the write effort and duration, and can increase the probability of magnetic precession to the desired state.

Figure 1:
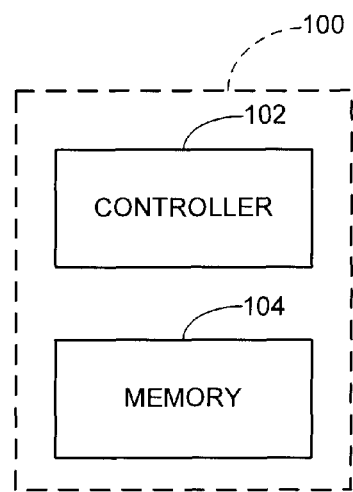
FIG. 1 provides a functional block representation of a data storage device.

FIG. 1 provides a simplified block representation of a data storage device 100 constructed and operated in accordance with various embodiments of the present invention. It is contemplated that the device constitutes a memory card that can be mated with a portable electronic device to provide data storage for the device. It will be appreciated, however, that the claimed subject matter is not so limited.

The device 100 is shown to include a controller 102 and a memory module 104. The controller 102 provides top level control of the device including interface operations with the host (not separately shown). The controller functionality may be realized in hardware or via a programmable processor, or may be incorporated directly into the memory module 104. Other features may be incorporated into the device 100 as well including but not limited to an I/O buffer, ECC circuitry and local controller cache.

Figure 2:
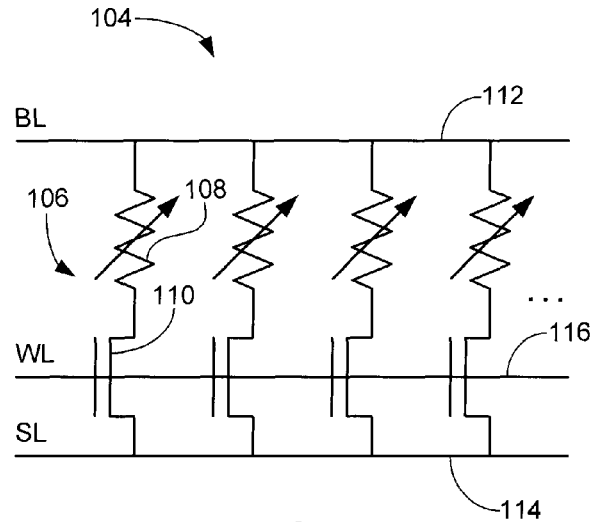
FIG. 2 depicts a portion of the memory module of FIG. 1.

The memory module 104 includes a solid-state array of non-volatile memory cells 106 as illustrated in FIG. 2. Each cell 106 includes a resistive sense memory element 108 and a switching device 110. The memory elements 108 are represented in FIG. 2 as variable resistors, in that the elements will establish different electrical resistances responsive to programming inputs to the cells. The switching devices 110 facilitate selective access to the individual cells during read and write operations.

In some embodiments, the memory cells 106 are characterized as spin-torque transfer random access memory (STRAM) cells. The memory elements 108 are characterized as magnetic tunneling junctions (MTJs), and the switching devices are characterized as nMOSFETs (n-channel metal oxide semiconductor field effect transistors). It will be appreciated that other cell configurations can readily be used.

Access to the cells 106 is carried out through the use of various control lines, including bit lines (BL) 112, source lines (SL) 114 and word lines (WL) 116. All of the cells 106 along a selected word line 116 may form a page of memory that is currently accessed during read and write operations. The array may include any number of M×N memory cells arranged in rows and columns. A cross-point array can be used in which only two control lines are directly coupled to each cell.

The various bit, source and control lines 112, 114 and 116 represented in FIG. 2 extend orthogonally across the array, and may be parallel or perpendicular to each other as required. Suitable driver circuitry (not shown) is coupled to the various control lines to pass selected read and write currents through the individual cells 106.

Figure 3:
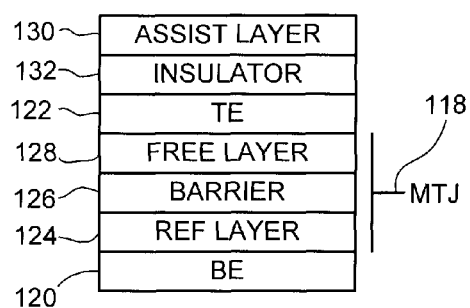
FIG. 3 shows an exemplary construction for a magnetic memory element of FIG. 2.

FIG. 3 provides a vertical stack representation of a selected memory element 108 from FIG. 2. An MTJ 118 is separated by conductive top and bottom electrodes 120, 122 (TE and BE, respectively). The MTJ 118 includes a reference layer (RL) 124 with a fixed magnetic orientation in a selected direction. The reference layer 124 can take a number of forms, such as an antiferromagnetic pinned layer with the fixed magnetic orientation established by an adjacent pinning layer, such as a permanent magnet. A synthetic antiferromagnetic (SAF) structure may alternatively be used. A tunneling barrier layer 126 separates the reference layer 124 from a soft ferromagnetic free layer 128, also sometimes referred to as a storage layer.

The free layer 128 has a selectively programmable magnetic orientation that is established responsive to the application of write current to the element 108. The programmed magnetic orientation of the free layer 128 may be in the same direction as the orientation of the reference layer 124 (parallel), or may be in the opposing direction as the orientation of the reference layer 126 (antiparallel). Parallel orientation provides a lower resistance $R_L$ through the memory cell, and antiparallel orientation provides a higher resistance $R_H$ through the cell.

It is contemplated that the magnetization direction of the reference and free layers 124, 128 will be perpendicular (i.e., in the vertical direction with respect to the drawing) but this is not necessarily required. For reference, the parallel orientation of the free layer provides a magnetization along an easy axis of the layer, and the antiparallel orientation of the free layer provides a magnetization along a hard axis of the layer.

While not shown in FIG. 3, it will be understood that the top electrode 122 establishes electrical contact with the associated bit line 112 (FIG. 2), and the bottom electrode 120 establishes electrical contact with the drain of the associated switching device 110.

FIG. 3 further shows a field assist layer 130. The assist layer 130 extends adjacent to the MTJ 118 and may be separated by an intervening electrical insulator layer 132. It is contemplated that the assist layer 130 will comprise a fourth control line that extends across the array in a selected direction, such as parallel with the bit lines 112.

Figure 4:
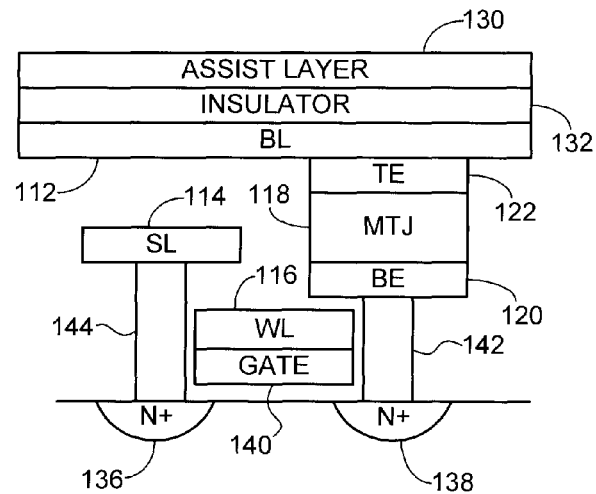
FIG. 4 is a structural depiction of a memory cell configured as in FIGS. 2-3.

FIG. 4 shows the memory cells of FIGS. 2-3 in accordance with some embodiments. It will be appreciated that other cell configurations can be used. In FIG. 4, a base semiconductor substrate 134 is provided with localized N+ doped regions 136, 138. A gate structure 140 spans the regions 136, 138 to form an n-channel transistor as the switching device 110. A selected word line 116 for the cell 106 is coupled to the gate 140.

An electrically conductive structure 142 extends from the doped region 138 to support the bottom electrode 120 and the MTJ 118. The top electrode 122 in turn is connected to a laterally extending bit line 112. The assist layer 130 extends in parallel with the bit line 112. A second electrically conductive structure 144 interconnects the doped region 136 with a longitudinally extending source line 114.

During a write operation, a spin (write) current is applied through the cell 106. The write current will pass either from the bit line 112 to the source line 114 or vice versa. The direction of the current is selected to precess the magnetization of the free layer to the desired direction.

After the write current is initiated, a field assist current is flowed along the assist layer 130. In at least some embodiments, the assist current does not align to either the easy or hard axes of the free layer 122, but instead is applied at a fixed angle with respect to the easy axis of the free layer, such as at an angle α=45 degrees.

The assist current generates an ampere field that helps to reduce the critical switching current density required to carry out the switching operation. Due to the applied field from the assist current being at an angle with respect to the write current, the initial magnetization angle for the free layer before switching may be large (e.g., on the order of from about 5-10 degrees), thereby reducing the switching time as well.

Spin current established during writing can induce precessional magnetization switching effects. The free layer will establish only one of two magnetization equalization states: an initial state just prior to switching and a final state after the switching event which is opposite the initial state. Due to the ringing nature of at least some forms of magnetization precession, the switching current pulse width should be well controlled to ensure the final magnetization settles upon the reversed equilibrium state; that is, to ensure that the applied write current changes the free layer from the initial state to the final desired state at the conclusion of the write operation. Some uncertainty in the final magnetization state can arise, particularly when shorter duration write pulses are applied. Under normal conditions, it may be difficult to achieve a high probability that the free layer will switch to the desired final state after a single attempt (e.g., a single write pulse).

Figure 5:
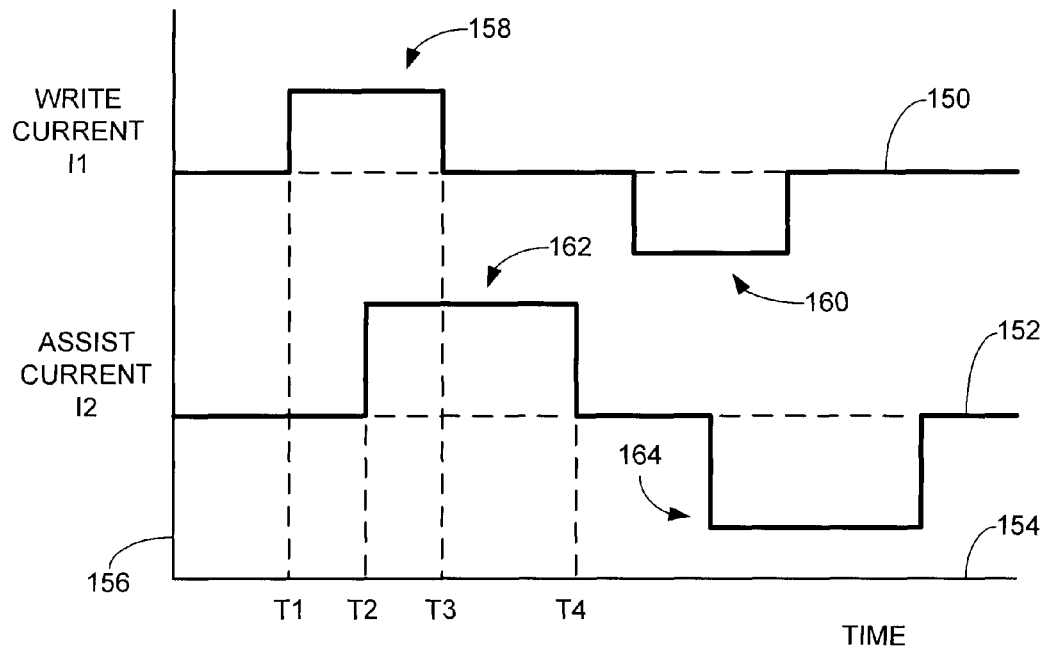
FIG. 5 is a graphical representation of overlapping write and field assist currents that may be applied in accordance with various embodiments.

Accordingly, various embodiments use an overlapping approach in the sequential application of the write and assist currents. FIG. 5 illustrates respective current waveforms 150, 152 for the write current (I1) and assist current (I2), respectively. The waveforms are plotted against an elapsed time x-axis 154 and a combined amplitude y-axis 156. The write current waveform 150 includes a first write current pulse 158 in a first direction and a second write current pulse 160 in an opposing, second direction.

These write current pulses 158, 160 carry out programming of the cell 106 to opposing states. While these pulses are shown to be nominally equal in magnitude and duration, those with skill will appreciate that the antiparallel switching pulse may be greater in magnitude and/or duration than the pulse required to carry out parallel switching.

The assist current waveform 152 includes corresponding pulses 162, 164. These pulses overlappingly trail the write current pulses 158, 160 as shown. While the assist current pulses 162, 164 are shown to be of equal magnitude and direction, it will be appreciated that these pulses may also vary depending on the direction of the write current pulses. Moreover, the current pulses may take any number of shapes, including shapes that increase or decrease in magnitude over time.

In this approach, a small write current pulse I1 (such as 158) is applied to initiate magnetic rotation of the free layer 128 at time T1. The assist current pulse I2 (such as 162) is subsequently applied at time T2, while the write current continues to be applied. In some embodiments, the assist current will generate an ampere field having a direction that is initially the same as, or close to, the direction of the final magnetization state. Both currents are applied until a time T3, at which point the write current pulse 158 terminates. The assist current pulse 162 continues to be applied until time T4, after which the assist current is also removed.

When the spin current from the write current pulse 158 is withdrawn (at time T3), the continued application of the assist current pulse 162 will help to determine a local energy minimization state, which can significantly increase the switching probability to a value close to 1. That is, the probability that the free layer will in fact settle upon the desired programmed state in one write attempt will be substantially assured due to the continued presence of the ampere field after the write current is withdrawn. This probability function may be modeled with an exponential dependent on the external bias field. In general terms, the stronger the ampere field, the higher the probability function will approach the unit case (e.g., a probability of P=1).

Figure 6:
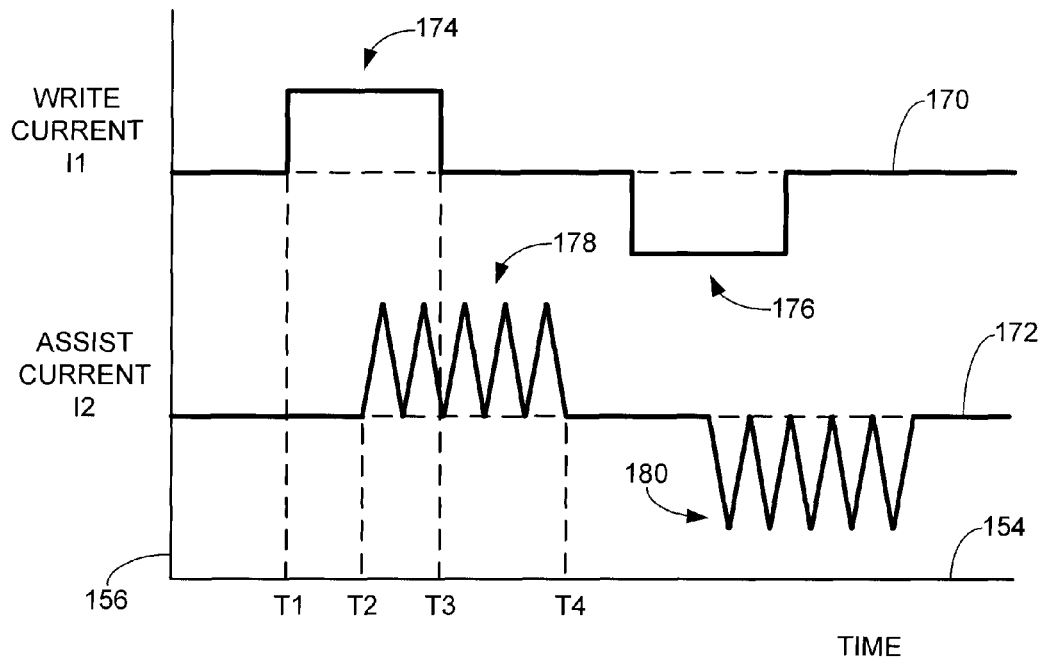
FIG. 6 is a graphical representation of overlapping write and assist currents that may be applied in further embodiments.

FIG. 6 shows an alternative manner in which precessional magnetization switching can be carried out. FIG. 6 is similar to FIG. 5 and includes a write current (I1) waveform 170 and an assist current (I2) waveform 172. These waveforms include corresponding current pulses 174, 176 and 178, 180 which are generally applied in the sequence described above.

The write current pulses 178, 180 are each characterized as having a high frequency component at a selected, relatively high frequency. The high frequency assist current pulses provide a high frequency varying ampere field. Generally, when the frequency of the assist current establishes a ferromagnetic resonance condition, the precession angle of the free layer will rapidly increase, promoting fast switching to the desired state. It will be appreciated that the write current may also or alternatively be applied as a sequence of high frequency pulses.

Figure 7:
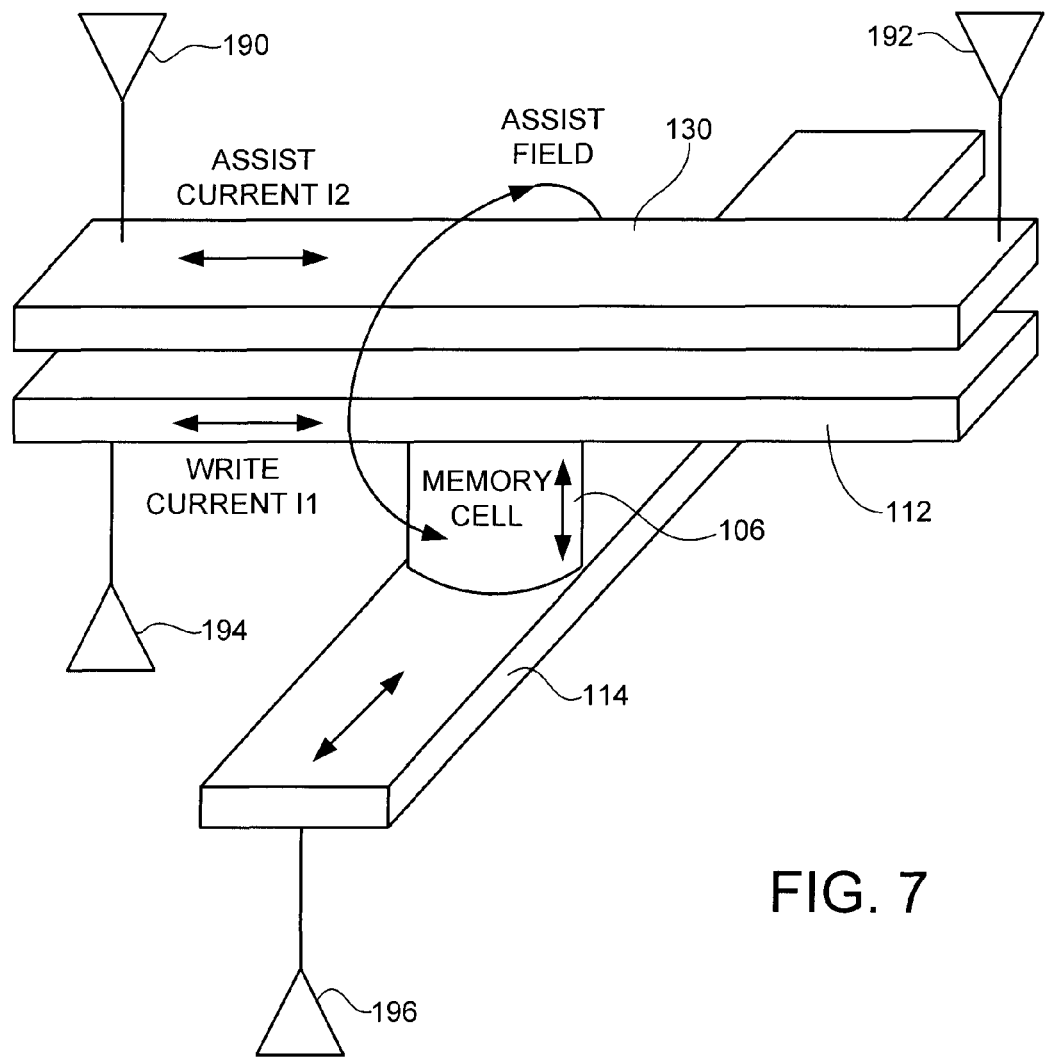
FIG. 7 shows one configuration of an assist layer adjacent a memory cell.

FIG. 7 shows one approach to achieving the aforementioned field assisted precession. In FIG. 7, the assist layer 130 extends as a conductor that runs in parallel, spaced apart relation to a bit line 112 across the array 104. The respective write and assist currents I1 and I2 are shown. It will be noted that the direction of the assist field will be dependent upon the direction of current flow along the assist layer 130. It will be appreciated that the assist layer conductor can extend in other directions across the array, including perpendicular to the bit lines 112 or at some other angle (such as 45 degrees with respect to the bit lines). Other mechanisms can be used to generate the assist field as well, such as localized coils or other structures adapted to provide an assist layer that generates the requisite assist field.

The assist layer 130 is coupled to respective current drivers 190, 192 which establish the requisite flow of field assist current through the assist layer in the desired direction. Similarly, bit line driver 194 and source line driver 196 cooperate to flow the write current through the memory cell 106 in the desired direction.

In each of the various embodiments presented herein, the assist field does not need to be excessively large in order to effect the desired magnetization precession. It has been found that an assist field that is about 10 times smaller than the associated cell-switching field (Hc) established by the write (spin) current may be sufficient in many cases to reduce switching field distributions by a factor of 3-5×, and to increase the switching probability by a significant margin. This allows the selection of a space efficient, low power and low cost design.

Figure 8:
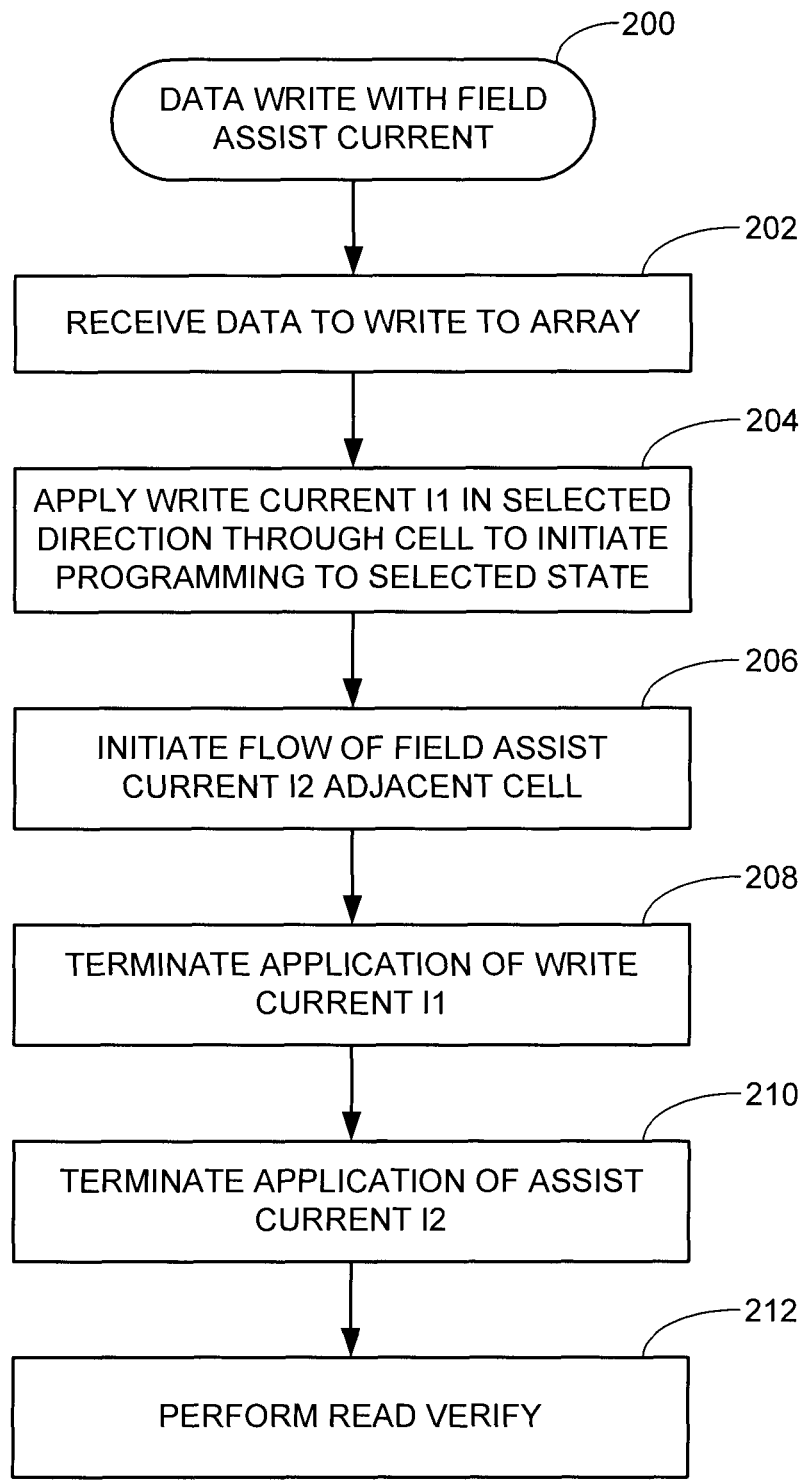
FIG. 8 shows a DATA WRITE WITH FIELD ASSIST CURRENT routine generally illustrative of steps carried out in accordance with various embodiments.

FIG. 8 sets forth a DATA WRITE WITH FIELD ASSIST CURRENT routine 200 generally illustrative of steps carried out in accordance with the foregoing discussion. Data to be written to the array 104 are received at step 202, and the device 100 identifies various cells to be programmed to respective states in order to store the received data. For each selected cell, a write current pulse is applied at step 204 to initiate the programming of the cell to the desired state.

A flow of field assist current is subsequently initiated during the continued application of the write current at step 206. The write (spin) current is terminated at step 208, followed by termination of the assist current at step 210. As desired, a read-verify operation may be carried out upon the cell at step 212 to determine whether the cell achieved the desired state. However, the enhanced probability that the field assist current ensured magnetization precession to the desired final state may make read verify operations unnecessary during normal operation.

It will now be appreciated that the various embodiments presented hereinabove can provide a number of benefits in the writing of data to magnetic memory elements. The use of field assisted magnetic precession writing as described herein can significantly improve the probability that the memory cell will achieve the desired written state in one write attempt. The ampere field can further reduce the duration and magnitude of the write current pulse, thereby providing faster data access operations with lower overall power consumption requirements.

A current-only switching method for the memory cells may have a relatively tight write current uniformity requirement in order to achieve the desired write states. This requirement may be relaxed using field assisted switching as set forth herein, which may lead to improvements in both the manufacturability and the subsequent reliability of the array during field use.

A related benefit that may arise from some embodiments disclosed herein is the fact that read operations involve applying a relatively low magnitude read current through the memory cells to sense their programmed states. The use of field assist currents during writing as embodied herein may reduce the magnitude of the write current that needs to be passed through the memory cells during read operations. Depending on how much write current magnitude reduction can be achieved, a single current generation circuit of the device may be able to generate both the read and write currents, rather than requiring separate read and write current generation circuits as in the case of typical current-only switching systems.

The various embodiments disclosed herein are suitable for use in a write-once or write many memory. While STRAM memory cells have been used as an illustrative embodiment, the present disclosure is not so limited, as any number of different types of magnetic element constructions can incorporate the above techniques, including solid-state and rotatable magnetic memories.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
applying a write current through a magnetic memory element to initiate magnetic precession of the element to a desired magnetic state; and
subsequently initiating a flow of a field assist current adjacent the magnetic memory element during continued application of the write current to induce a magnetic field upon the element, the field assist current persisting after the write current is terminated to provide field assisted precession to the desired magnetic state, the field assist current having a relatively high frequency component of selected frequency to generate a corresponding time-varying ampere field at said selected frequency.

2. The method of claim 1, in which the field assist current flows along a conductor which extends in adjacent non-contacting relation to the magnetic memory element.

3. The method of claim 1, in which the magnetic memory element includes a magnetic tunneling junction (MTJ) coupled to a switching device, and the magnetic field passes through a free layer of the MTJ having a selectable magnetic orientation to facilitate precessional switching of the free layer to said desired state.

4. The method of claim 1, in which the applying step comprises passing the write current through the magnetic memory element from a first control line to a second control line each connected to said magnetic memory element, and the subsequently initiating step comprises establishing said flow of field assist current through a third control line which extends adjacent in non-contacting relation to the memory element and the first and second control lines.

5. The method of claim 1, in which the field assist current is flowed at a non-orthogonal angle with respect to an easy axis of a free layer of the magnetic memory element.

6. The method of claim 1, in which the field assist current is passed along a conductor in a direction adjacent the memory element selected in relation to a direction of the write current through the memory element.

7. The method of claim 1, in which the magnetic memory element comprises a reference layer with a fixed magnetic orientation and a free layer with a variable magnetic orientation established by the application of the write current and the field assist current, the magnetic orientation of the reference layer parallel to a direction of flow of the write current through the magnetic memory element.

8. The method of claim 1, in which the memory element is characterized as a spin-torque transfer random access memory (STRAM) memory cell with a reference layer and a free layer separated from the reference layer by a tunneling barrier layer, the reference layer having a fixed magnetic orientation and the free layer having a variable magnetic orientation that can be switched between a parallel orientation and an antiparallel orientation with respect to the orientation of the reference layer.

9. An apparatus comprising:
a magnetic memory element programmable to a desired magnetic state responsive to an application of write current to the memory element; and
an assist layer extending in non-contacting abutment to the magnetic memory element adapted to initiate a flow of a field assist current during continued application of the write current to induce a magnetic field upon the element, the field assist current persisting after the write current is terminated to provide field assisted precession to the desired magnetic state, the field assist current flowed at a non-orthogonal angle with respect to an easy axis of a free layer of the magnetic memory element.

10. The apparatus of claim 9, further comprising a current driver adapted to flow the field assist current along the assist layer in a selected direction responsive to a direction of flow of the write current.

11. The apparatus of claim 9, in which the assist layer comprises a conductor which extends in adjacent non-contacting relation to the magnetic memory element.

12. The apparatus of claim 9, in which the magnetic memory element includes a magnetic tunneling junction (MTJ) coupled to a switching device, and the magnetic field passes through a free layer of the MTJ having a selectable magnetic orientation to facilitate precessional switching of the free layer to said desired state.

13. The apparatus of claim 9, in which the applying step comprises passing the write current through the magnetic memory element from a first control line to a second control line each connected to said magnetic memory element, and the subsequently initiating step comprises establishing said flow of field assist current through a third control line which extends adjacent in non-contacting relation to the memory element and the first and second control lines.

14. The apparatus of claim 9, in which the magnetic memory element comprises a reference layer with a fixed magnetic orientation and a free layer with a variable magnetic orientation established by the application of the write current and the field assist current, the magnetic orientation of the reference layer parallel to a direction of flow of the write current through the magnetic memory element.

15. The apparatus of claim 9, in which the field assist current is passed along a conductor in a direction adjacent the memory element selected in relation to a direction of the write current through the memory element.

16. The apparatus of claim 9, in which the field assist current has a relatively high frequency component of selected frequency to generate a corresponding time-varying ampere field at said selected frequency.

17. An apparatus comprising:
an array of non-volatile magnetic data storage cells;
a first current driver adapted to flow a write current through a selected cell of said array to initiate magnetic precession of a free layer of the selected cell to a desired magnetic state; and
a second current driver adapted to subsequently initiate a flow of a field assist current adjacent the selected cell during continued application of the write current to induce a magnetic field upon the cell, the field assist current persisting after the write current is terminated to provide field assisted precession to the desired magnetic state, wherein a selected one of the write current or the field assist current comprises a relatively high frequency component of selected frequency to generate a corresponding time-varying ampere field at said selected frequency.

18. The apparatus of claim 17, further comprising a controller which directs the first and second current drivers to initiate said write current and field assist current, respectively, responsive to a request from a host device to store data to said array.

19. The apparatus of claim 17, further comprising a first control line coupled between the first current driver and the selected cell adapted to transmit said write current to the selected cell, and a second control line coupled to the second current driver and which passes in non-contacting abutment with the first control line and the selected cell to transmit said field assist current adjacent the selected cell.

20. The apparatus of claim 17, characterized as a portable memory card.

* * * * *